(12) United States Patent
Katayama et al.

(10) Patent No.: US 7,296,209 B2
(45) Date of Patent: Nov. 13, 2007

(54) APPARATUS FOR ENCODING AND DECODING

(75) Inventors: Yasunao Katayama, Hachiouji (JP); Toshiyuki Yamane, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 768 days.

(21) Appl. No.: 10/608,464

(22) Filed: Jun. 27, 2003

(65) Prior Publication Data

US 2004/0054651 A1 Mar. 18, 2004

(30) Foreign Application Priority Data

Jun. 28, 2002 (JP) ............................. 2002-190742

(51) Int. Cl.
*H03M 13/00* (2006.01)
(52) U.S. Cl. ...................... 714/758; 714/788; 714/714
(58) Field of Classification Search ................ 714/758, 714/759, 785, 788, 771, 763, 768, 756, 714, 714/702
See application file for complete search history.

(56) References Cited

U.S. PATENT DOCUMENTS 5,732,088 A * 3/1998 Sako ........................... 714/701
5,856,890 A * 1/1999 Hamai et al. ................. 360/53
5,905,741 A * 5/1999 Matsukuma et al. ........ 714/758
6,453,439 B1 * 9/2002 Hattori et al. ............... 714/755
7,061,936 B2 * 6/2006 Yoshimura et al. .......... 370/474

FOREIGN PATENT DOCUMENTS

| JP | 10-154942 | 6/1998 |
| JP | 10-154942 | 9/1998 |
| JP | 2001-160761 | 6/2001 |
| JP | 2001-160761 | 12/2001 |

* cited by examiner

*Primary Examiner*—Guy Lamarre
*Assistant Examiner*—Fritz Alphonse
(74) *Attorney, Agent, or Firm*—Ido Tuchman; E. Dwayne Nelson (57) ABSTRACT

A communication device which executes proper communications by correcting communication errors caused by noise generated on a transmission line or the like. An encoding device for adding error correction code to an input data sequence is provided with a first code encoding unit for adding binary error correction code to first data blocks into which the input data sequence is divided, and a second code encoding unit for adding a symbol error correction code for correcting errors by a symbol unit of a predetermined length to second data blocks into which the input data sequence is divided in a form different from that of the plurality of first data blocks.

21 Claims, 5 Drawing Sheets

APPARATUS FOR ENCODING AND DECODING

BACKGROUND OF THE INVENTION

The present invention relates to an encoding device, a decoding device, an encoding method, a decoding method, a program, a program recording medium, and a data recording medium. More specifically, the invention relates to an encoding device, a decoding device, an encoding method, a decoding method, a program, a program recording medium, and a data recording medium which use Reed-Solomon codes.

According to Japanese patent No. 3272307, Reed-Solomon codes or BCH codes used for a communication device or the like which needs high reliability are used as product codes, and decoding is iterated to enable error correction by a higher coding gain than that of a system standardized by ITU-T. G. 709. For example, according to "Enabling Next Generation Optical Networks with Forward Error Correction", by S. Keeton,, S. Sridharan, and M. Jarchi, pp. 54 of National Fiber Optic Engineers Conference 2001, a method of executing error correction by using BCH codes as product codes, and iterative decoding has been presented.

According to the above-described method, in an area of a relatively high error rate in which a bit error rate (BER) is about $10^{-5}$, error correction of a large coding gain can be executed. However, in recent optical communications or the like, because of a high communication data rate, preferably, BER after addition of error correction codes is limited to about $10^{-15}$ or higher. In such a case, the above-described method may be adversely affected by an error floor of an escape pattern to disable acquisition of a sufficient coding gain. The method which needs a large number of iterations is not preferable from the standpoint of a circuit size and power consumption.

SUMMARY OF THE INVENTION

Therefore, objects of the present invention are to provide an encoding device, a decoding device, an encoding method, a decoding method, a program, a program recording medium, and a data recording medium which can solve the problems described above.

According to a first aspect of the present invention, an encoding device, an encoding method, a program realizing the method, and a program recording medium recording the program are provided. The encoding device for adding an error correction code to an input data sequence comprises: a first code encoding unit for adding a binary error correction code to each of a plurality of first data blocks into which the input data sequence is divided; and a second code encoding unit for adding a symbol error correction code for correcting an error by a symbol unit of a predetermined length to each of a plurality of second data blocks into which the input data sequence is divided in a form different from that of the plurality of first data blocks, wherein the number of bit errors to be corrected by the binary error correction code per total number of bits of the first data block to which the binary error correction code is added is larger than the number of bit errors to be corrected by the symbol error correction code per total number of bits of the second data block to which the symbol error correction code is added.

According to a second aspect of the present invention, a decoding device, a decoding method, a program realizing the method, and a program recording medium recording the program are provided. The decoding device for correcting errors of an encoded data sequence to which an error correction code is added comprises: a storage unit for storing the encoded data sequence; a first error correction unit for correcting an error of each of a plurality of first data blocks, into which the encoded data sequence is divided, by minimum distance decoding of a binary error correction code; and a second error correction unit for correcting an error of each of a plurality of second data blocks, into which the encoded data sequence is divided in a form different from that of the plurality of first data blocks, by minimum distance decoding of a symbol error correction code for error correction by a symbol unit of a predetermined length; a below bounded distance decoding control unit for causing the first error correction unit and the second error correction unit to respectively correct errors having smaller distance than limit error correction capabilities of the binary error correction code and the symbol error correction code; and a bounded distance decoding control unit for causing, if determination is made that the errors are not corrected by the below bounded distance decoding control unit, each of the first error correction unit and the second error correction unit to correct errors by using the limit error correction capability of each of the binary error correction code and the symbol error correction code.

According to a third aspect of the present invention, a decoding device, a decoding method, a program realizing the method, and a program recording medium recording the program are provided. The decoding device for correcting errors of an encoded data sequence to which an error correction code is added comprises: a storage unit for storing the encoded data sequence; a first error correction unit for correcting an error of each of a plurality of first data blocks, into which the encoded data sequence is divided, by minimum distance decoding of a binary error correction code; a second error correction unit for correcting an error of each of a plurality of second data blocks, into which the encoded data sequence is divided in a form different from that of the plurality of first data blocks, by minimum distance decoding of a symbol error correction code for error correction by a symbol unit of a predetermined length; a below bounded distance decoding control unit for causing the first error correction unit and the second error correction unit to respectively correct errors having smaller distance than limit error correction capabilities of the binary error correction code and the symbol error correction code; and a bounded distance decoding control unit for causing, if determination is made that the errors are not corrected by the below bounded distance decoding control unit, each of the first error correction unit and the second error correction unit to correct errors by using the limit error correction capability of each of the binary error correction code and the symbol error correction code.

According to a fourth aspect of the present invention, a data recording medium is provided for recording an input data sequence and an error correction code added to the input data sequence. The data recording medium comprises: a data sequence recording area for recording the input data sequence; a first code recording area for recording a binary error code recorded corresponding to each of a plurality of first data blocks, into which the input data sequence is divided, and used for correcting an error of each of the plurality of first data blocks; and a second code recording area for recording a symbol error correction code recorded corresponding to each of a plurality of second data blocks, into which the input data sequence is divided in a form different from that of the plurality of first data blocks, and used for correcting an error of each of the plurality of second data blocks by a symbol unit of a predetermined length, wherein the number of bit errors to be corrected by the binary error correction code per total number of bits of the first data block to which the binary error code is added is larger than the number of bit errors to be corrected by the symbol error correction code per total number of bits of the second data block to which the symbol error correction code is added.

In the foregoing summary of the present invention, not all the features of the invention are cited, and a subcombination of these feature groups are also within the present invention.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENT

Figure 1:
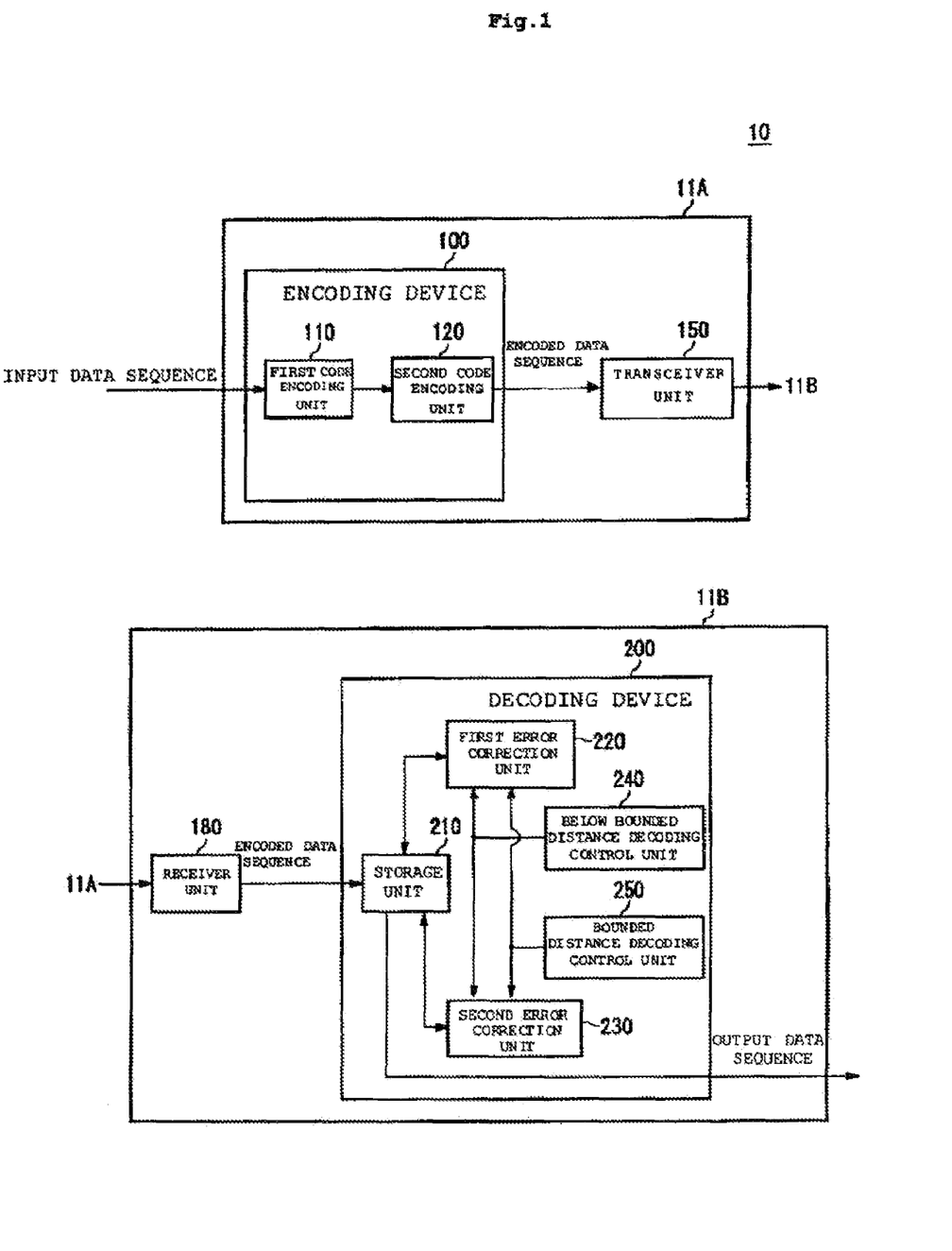
FIG. 1 is a functional block diagram of a communication system 10.

FIG. 1 is a functional block diagram of a communication system 10. The communication system 10 is provided with communication devices 11A and 11B, and encodes an input data sequence to execute error correction. That is, the communication device 11A receives the input data sequence, and adds codes used for error correction to transmit the sequence as an encoded data sequence through a transmission line to the communication device 11B. The communication device 11B corrects errors of the encoded data sequence by using error correction codes.

Thus, even if there is noise or the like on the transmission line, the communication system 10 can transmit/receive data close to the original input data sequence. Especially, the communication system 10 combines Reed-Solomon error correction codes with binary error correction codes under predetermined conditions to obtain a large coding gain by a small parity overhead, and to be effective for both random and burst errors, and can add error correction codes of a structure to be decoded relatively easily.

The communication system 11A is provided with an encoding device 100 and a transceiver unit 150. The encoding device 100 has first and second code encoding units 110 and 120. The first code encoding unit 110 receives the input data sequence from the outside, adds binary error codes thereto and send the input data sequence to the second code encoding unit 120. The second code encoding unit 120 adds Reed-Solomon error codes, that is symbol error correction codes, to the input data sequence to which the binary error codes have been added and send the input data sequence to the transceiver unit 150 as an encoded data sequence. The transceiver unit 150 transmits the received encoded data sequence through the transmission line to the communication device 11B.

The communication device 11B is provided with a receiver unit 180 and a decoding device 200. Upon reception of the encoded data sequence from the communication device 11A through the transmission line, the receiver unit 180 sends the encoded data sequence to the decoding device 200. The decoding device 200 has a storage unit 210, first and second error correction units 220 and 230, a below bounded distance decoding control unit 240, and a bounded distance decoding control unit 250. The storage unit 210 stores the encoded data sequence received from the receiver unit 180 to be referred to by the first and second error correction units 220 and 230. In addition, upon reception of a notice of error correction completion from the first or second error correction units 220 or 230, the storage unit 210 outputs the stored encoded data sequence as an output data sequence.

The first error correction unit 220 corrects errors of the encoded data sequence in the storage unit 210 by minimum distance decoding of the binary error correction codes. The second error correction unit 230 corrects errors by minimum distance decoding of the symbol error correction codes. Upon completion of the error corrections, the first and second error correction units 220 and 230 send notices of error correction completion to the storage unit 210. The below bounded distance decoding control unit 240 uses the first and second error correction units 220 and 230 to correct errors under limit error correction capabilities thereof, and sends an instruction to continue error correction to the bounded distance decoding control unit 250 if the error correction is not completed. Upon reception of the instruction, the bounded distance decoding control unit 250 uses the limit error correction capabilities of the first and second error correction units 220 and 230 to correct errors of the encoded data sequence in the storage unit 210.

Functions of both of the communication devices 11A and 11B may be incorporated in the same communication device.

Thus, the communication system 10 can correct errors by encoding the input data sequence even if there is noise on the transmission line or the like. As a result, the communication device 11A can properly communicate with the communication device 11B.

Figure 2:
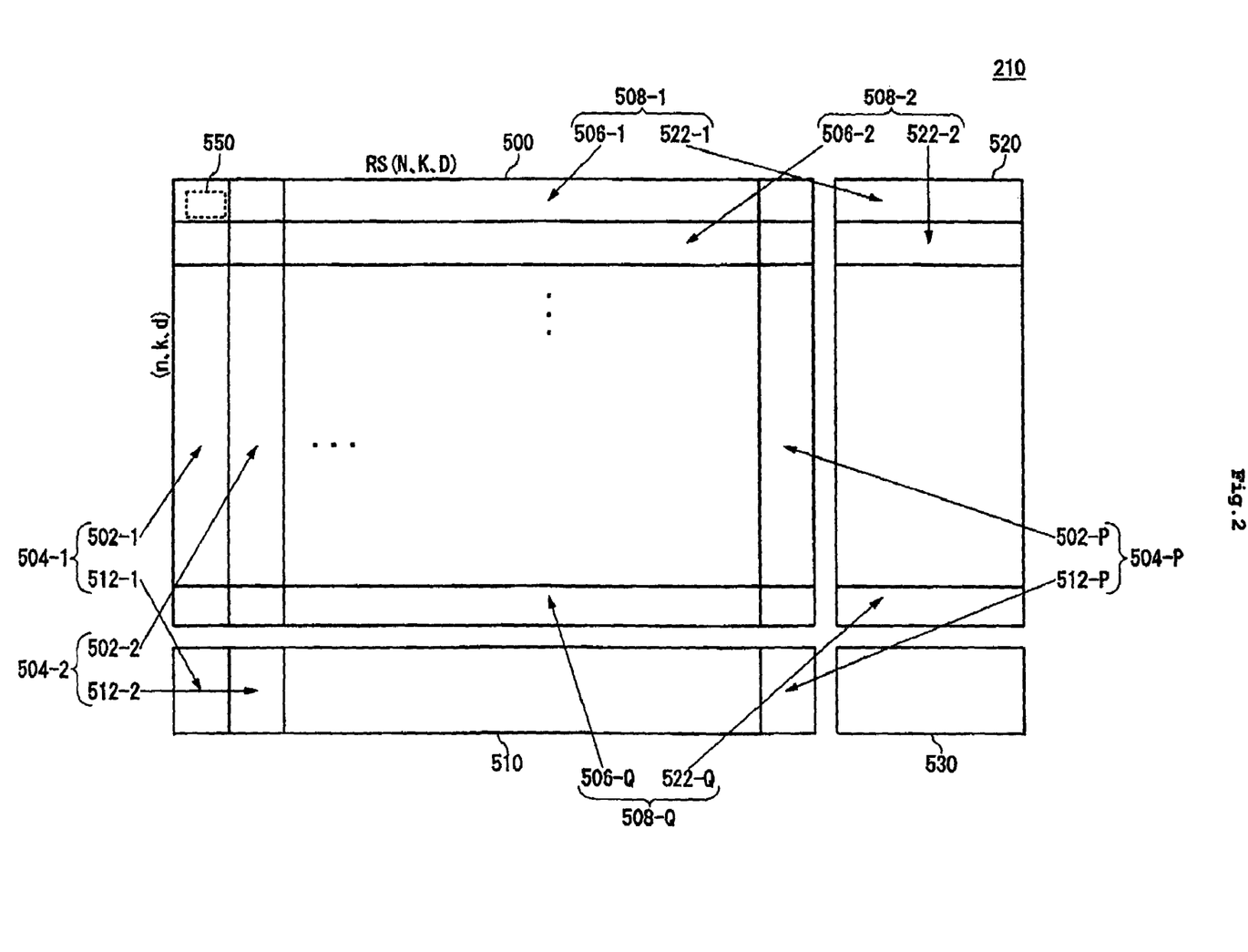
FIG. 2 is a view showing an example of encoded data stored in a storage unit 210.

FIG. 2 shows an example of encoded data stored in the storage unit 210. The storage unit 210 is an example of a data recording medium of the present invention, and includes a data sequence recording area 500 for recording the input data sequence, first and second code recording areas 510 and 520, and a parity-on-parity 530.

The data sequence recording area 500 records a first data block 502 generated by dividing the input data sequence into predetermined lengths. According to the embodiment, the first code encoding unit 110 divides the input data sequence so as to make each of a plurality of first data blocks 502 a continuous part of the input data sequence, and sequentially generates first data blocks 502-1 to 502-P. As another example, the first code encoding unit 110 may divide the input data sequence so as not to make each of the plurality of first data blocks 502 a continuous part of the input data sequence.

In the first code recording area 510, binary error correction code parities 512-1 to 512-P are recorded respectively corresponding to the first data blocks 502-1 to 502-P, and used to correct errors of the first data blocks 502-1 to 502-P. That is, the first code encoding unit 110 adds the binary error correction code parities 512-1 to 512-P respectively to the first data blocks 502-1 to 502-P to form binary error correction codes 504 which are inner codes of concatenated codes. For example, the binary error correction code parity 512-1 corresponds to the first data block 502-1 to form a binary error correction code 504-1. Similarly, the binary error correction code parity 512-2 corresponds to the first data block 502-2 to form a binary error correction code 504-2.

Second data blocks 506-1 to 506-Q are divisions of the input data sequence based on a form different from that of the first data block 502, and constituted by selecting partial data from the first data blocks 502-1 to 502-P. For example, the second data blocks 506-1 to 506-Q may be constituted by selecting data having a length of a symbol 550 as partial data, or data having lengths of a plurality of symbols 550 or the like that are different from the length of the symbol 550.

In the second code recording area 520, Reed-Solomon error correction code parities 522-1 to 522-Q are recorded respectively corresponding to a plurality of second data blocks 506-1 to 506-Q, and used to correct errors of the second data blocks 506-1 to 506-Q by symbol 550 units. That is, the second code encoding unit 120 adds the Reed-Solomon error correction code parities 522-1 to 522-Q to the second data blocks 506-1 to 506-Q respectively to form Reed-Solomon error correction codes 508-1 to 508-Q which are outer codes of concatenated codes. For example, the Reed-Solomon error correction code parity 522-1 corresponds to the second data block 506-1 to form the Reed-Solomon error correction code 508-1. Similarly, the Reed-Solomon error correction code parity 522-2 corresponds to the second data block 506-2 to form the Reed-Solomon error code 508-2.

The communication system 10 may add codes having the structure of the Reed-Solomon error correction code 508 and that of the binary error correction code 504 being exchanged. For example, the communication system 10 may add binary error correction codes as outer codes, and Reed-Solomon error correction codes as inner codes.

As described above, the communication system 10 divides the input data sequence into the first and second data blocks 502 and 506 in the forms different from each other, and adds error correction codes to each division to record the data sequence in the storage unit 210 or the like. Accordingly, the communication system 10 can correct errors of the input data sequence by effectively using characteristics of both of the first and second data blocks 502 and 506. To effectively execute error correction, the communication system 10 may use the parity-on-parity 530 which is the binary error correction code parity 512 as an error correction code for the Reed-Solomon error correction codes parity 522. As another example, in accordance with configuration requirements of inner and outer codes, for example, if a total number of bits k of the first data block is not an integer multiple of a number of bits m of a symbol, the communication device 10 may further use, as the parity-on-parity 530, the binary error correction code parity 512 and the Reed-Solomon error correction code parity 522 which is an error correction code for a part of the first data block.

Next, a specific example of the above-described error codes is cited.

For example, the number of bit errors to be corrected by the binary error correction code parity 512 per total number of bits of the binary error correction code 504 of the first data block 502, to which the binary error correction code parity 512 is added, is larger than the number of bit errors to be corrected by the Reed-Solomon error correction code parity 522 per total number of bits of the Reed-Solomon error correction code 508 of the second data block 506 to which the Reed-Solomon error correction code parity 522 is added.

More specifically, the first and second code encoding units 110 and 120 add the binary error code parity 512 and the Reed-Solomon error correction code parity 522 to the input data sequence which satisfy the following inequality when a total number of bits of the binary error correction code 504 is n, a minimum distance (e.g., Hamming distance) between a plurality of binary error correction codes 504 is d, a length of the Reed-Solomon error correction code 508 is an N symbol, a minimum distance between codes of the second data block 506 is D, and a total number of bits of a symbol is m, $$\frac{d-1}{2n} > \frac{D-1}{2mN} \qquad \text{[Mathematical 3]}$$

Here, preferably, n is at least twice as large as m from the standpoint of effective error correction (e.g., n is a multiple of an integer 2 or more with respect to m). If the total number of bits of the binary error correction code 504 is about equal to the length of the symbol 550 of the typical Reed-Solomon error correction code 508 (m=8), large parity-on-parity is necessary even for correction of a 1-bit error. In the case of the Reed-Solomon error correction code 508 where the length m of the symbol 550 is large, efficiency is low from the standpoint of correction of random errors.

The first and second error correction units 220 and 230 similarly correct errors of the input data sequence by the binary error correction code 504 and the Reed-Solomon error correction code 508 which satisfy the above-described inequality.

The Reed-Solomon error correction codes 508 is, for example, the symbol error correction code where 8 bits constitute a symbol of (N, K, D)=(255, 239, 17) defined by $GF(2^8)$. Note, N denotes a code length (length of Reed-Solomon error correction code 508), K a signal length of data before encoding (length of second data block 506), and D a minimum distance.

According to the embodiment, the communication system 10 makes formation of escape patterns difficult by using a symbol error correction code of a large minimum distance.

The binary error correction code 504 is, for example a binary code of (n, k, d)=(128, 113, 6) having a double-bit error correction function, and a 3-bit error detection function which has larger number of bits than the one to be corrected, or a 4-bit byte error correction function. Note, n denotes a code length (total number of bits of binary error correction code 504), k a signal length of data before encoding (total number of bits of first data block 502), and d a minimum distance.

The binary error correction code parity 512 can correct random bit errors by a relatively large parity overhead. In the case of the binary error correction code 504, when errors are detected by the error detection function, the errors may not be corrected even if error correction is determined to be possible. In this case, especially if the number of bits of detected errors is near the limit of the error correction capability by the binary error code correction code 504, the binary error correction code 504 can limit possibility of erroneous correction. Further, the Reed-Solomon error correction code 508 enables effective error correction by using error detection information of the binary error correction code 504.

The communication system 10 can configure, as the binary error correction code 504, a binary code of (n, k, d)=(128, 112, 6) by using 128 elements of $GF(2^8)$. For example, the communication system 10 can set the minimum distance d to 6 by selecting only elements of odd parities.

As another example, for the binary error correction code 504, a burst error detection function or a burst error correction function may be provided. In such a case, even when burst errors occur over a byte boundary, the binary error correction code parity 504 can properly correct or detect the errors to increase possibility of preventing erroneous correction during decoding, whereby more effective error correction can be executed.

Figure 3:
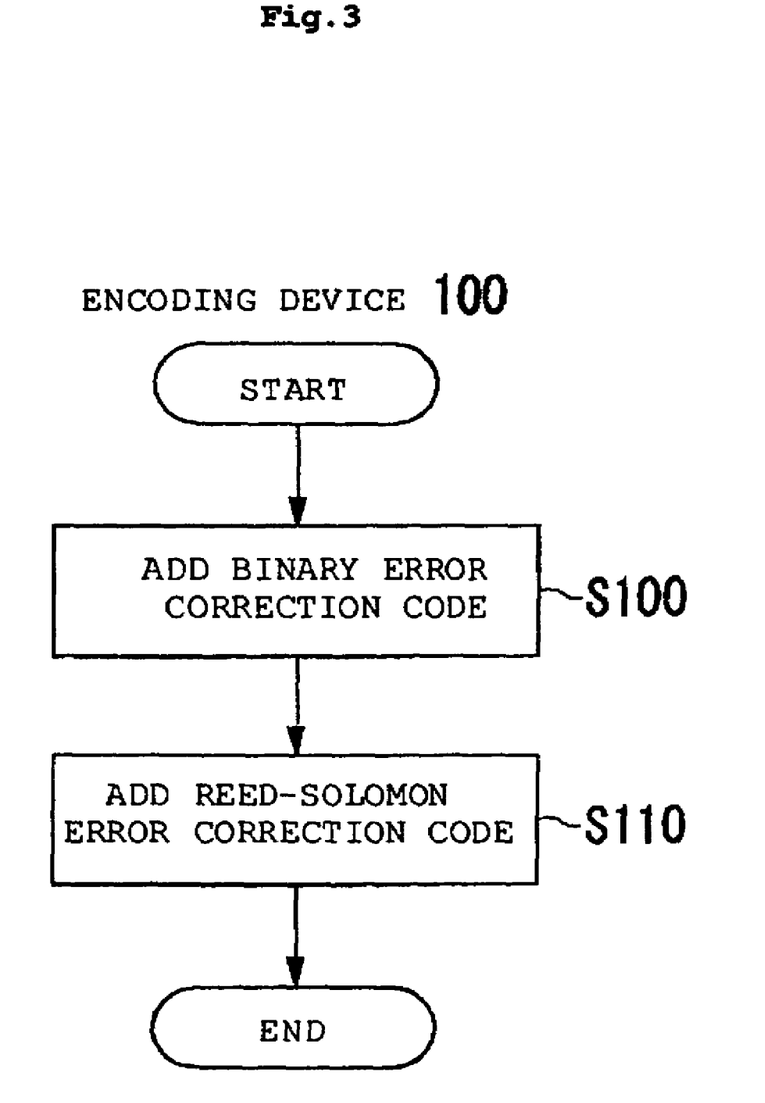
FIG. 3 is a flowchart showing an operation of an encoding device 100.

FIG. 3 is a flowchart showing an operation of the encoding device 100. The first code encoding unit 110 adds the binary error correction code parity to the input data sequence (S100). Then, the second code encoding unit 120 adds Reed-Solomon error correction codes to the input data sequence to which binary error correction codes have been added (S110).

The binary and Reed-Solomon error correction codes have characteristics such as those described above with reference to FIG. 2, and enable effective error correction by a relatively small overhead as a whole. As another example of the above-described encoding, the encoding device 100 may add the Reed-Solomon error correction codes before addition of the binary error correction codes.

Figure 4:
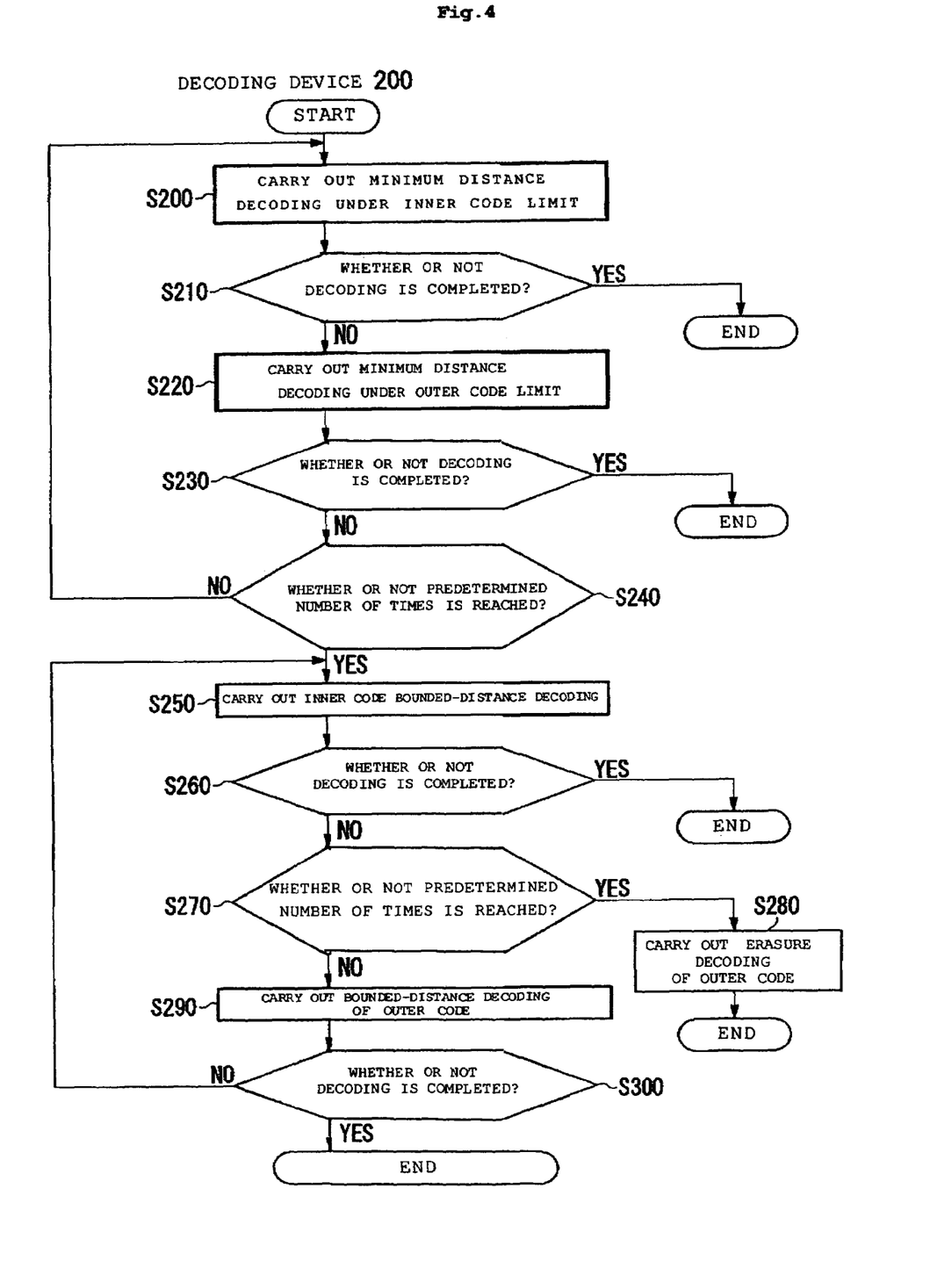
FIG. 4 is a flowchart showing an operation of a decoding device 200.

FIG. 4 is a flowchart showing an operation of the decoding device 200. The decoding device 200 executes the following decoding for the encoded data sequence received from the outside. First, the below bounded distance decoding control unit 240 causes the first error correction unit 220 to execute correction of under-limit error correction capability of the binary error correction code 504 by a hard decision method (S200). For example, in the example shown in FIG. 2, as double-bit error correction is possible by the binary error correction code 504, the below bounded distance decoding control unit 240 causes the first error correction unit 220 to execute 1-bit error correction which is less than 2 bits.

In addition to the random error correction, the first error correction unit 220 may execute burst error correction. In such a case, the decoding device 200 can effectively correct burst errors by the first error correction unit 220 in first step S200 of iterative decoding if an encoded data sequence often including the burst errors is entered.

Further, the first error correction unit 220 may execute only burst error detection if the encoded data sequence is determined to include large burst errors. In this case, the first error correction unit 220 can prevent erroneous correction of burst errors.

Upon determination of completion of the error correction of the encoded data sequence (S210: YES), the first error correction unit 220 ends the process. Subsequently, upon determination of incompletion of the error correction of the encoded data sequence (S210: NO), the below bounded distance decoding control unit 240 causes the second error correction unit 230 to execute correction of under-limit error correction capability of the Reed-Solomon error correction code 508 by the hard decision method (S220). Upon determination of completion of the error correction (S230: YES), the second error correction unit 230 ends the process.

Upon determination of incompletion of the error correction by the second error correction unit 230 (S230: NO), the below bounded distance decoding control unit 240 determines whether the number of times of iterating the error correction by the under-limit error correction capability from S200 to S230 has reached a predetermined number of times or not (S240). If the below bounded distance decoding control unit 240 determines that the number of times of iterating the error correction by the under-limit error correction capability from S200 to S230 has not reached the predetermined number of times (S240: NO), the decoding device 200 returns to step S220 to continue the process.

If the below bounded distance decoding control unit 240 determines that the number of times of iterating the error correction by the under-limit error correction capability from S200 to S230 has reached the predetermined number of time (S240: YES), the bounded distance decoding control unit 250 causes the first error correction unit 220 to execute correction of the limit error correction capability of the binary error correction code 504 by the hard decision method (S250). For example, in addition to the random error correction, the bounded distance decoding control unit 250 may execute further burst error correction by the first error correction unit 220. If only burst error detection is executed in S200, the first error correction unit 220 may execute burst error correction in S250. Subsequently, upon determination of completion of the error correction of the encoded data sequence (S260: YES), the first error correction unit 220 ends the process.

Upon determination of incompletion of the error correction of the encoded data sequence by the first error correction unit 220 (S260: NO), the bounded distance decoding control unit 250 determines whether the number of times of iterating the error correction by the limit error correction capability has reached the predetermined number of times or not (S270). If the bounded distance decoding control unit 250 determines that the number of times of iterating the error correction by the limit error correction capability has reached the predetermined number of times (S270: YES), the second error correction unit 230 can execute erasure decoding of the second data block 506 based on the result of the error correction using the binary error correction code 504 (S280).

If the bounded distance decoding control unit 250 determines that the number of times of iterating the error correction by the limit error capability has not reached the predetermined number of times (S270: NO), the second error correction unit 230 execute correction of the limit error capability of the Reed-Solomon error correction code 508 by a hard decision method (S290). Subsequently, upon determination of incompletion of the error correction of the encoded data sequence (S300: NO), the second error correction unit 230 returns to S250 to continue the process. Upon determination of completion of the error correction of the encoded data sequence (S300: YES), the process is ended. The predetermined number of times is decided by trade off between a total calculation amount of the iterative decoding and a coding gain. That is, the decoding device 200 may adjust time necessary for decoding and a coding gain based on the predetermined number of times in accordance with user's setting.

As described above, the communication system 10 uses the under-limit error correction capability in the first half of the error correction. Then, the communication system 10 uses the limit error correction capability after sufficient error correction executed by the under-limit error correction capability based on both outer and inner codes. Thus, in the case of correcting errors of the encoded data sequence possibly including errors equal to/higher than the correction capability, the communication system 10 can execute effective error correction by preventing erroneous correction in the first half of the error correction, using characteristics of the inner and outer codes.

As another example of the error correction, the decoding device 200 may execute only the latter half of the shown process. That is, the decoding device 200 may execute only error correction using only the limit error correction capability. Even in this form, by using the concatenated codes shown in FIG. 2, the decoding device 200 can effectively execute error correction based on the iterative decoding of the hard decision method.

Figure 5:
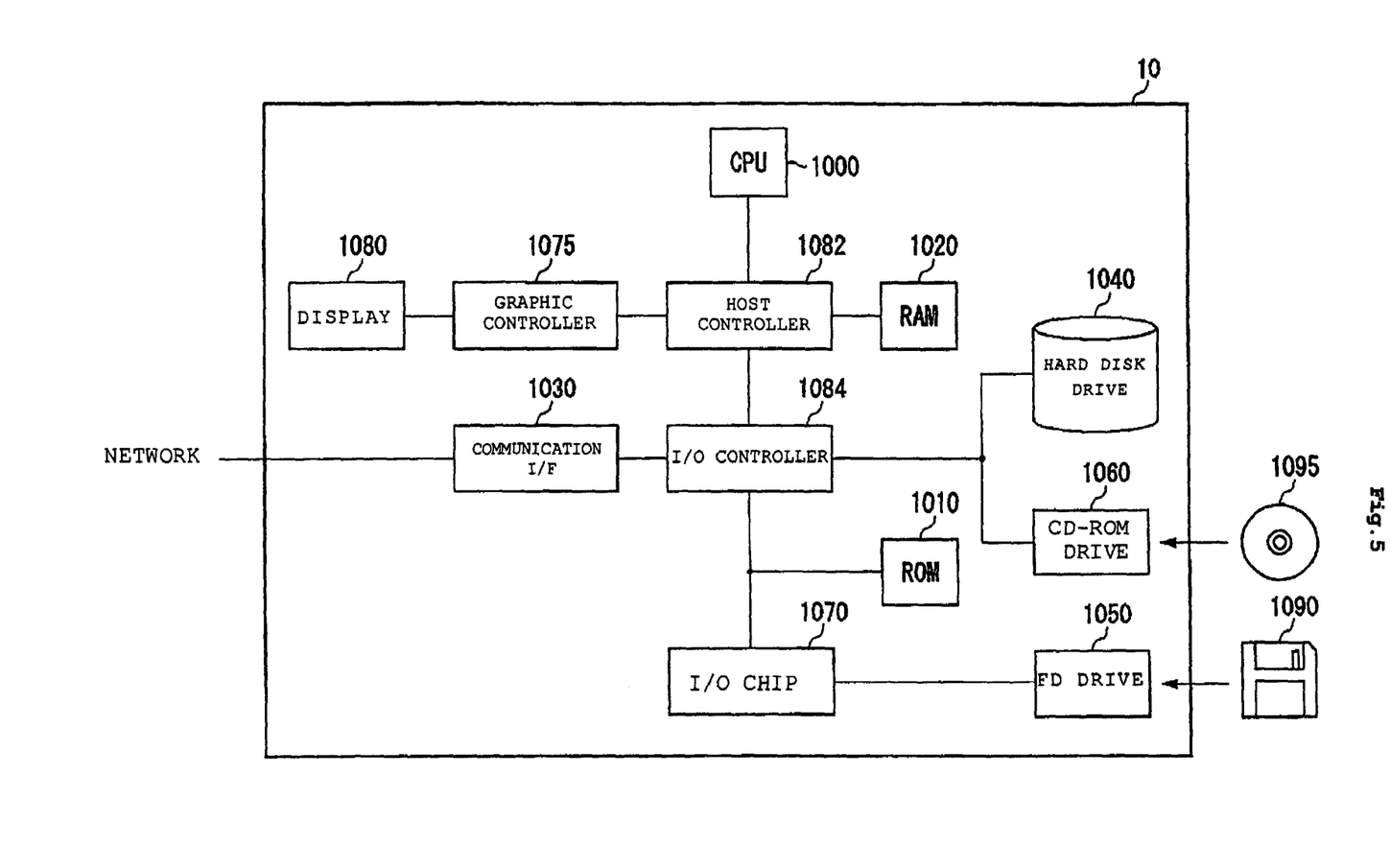
FIG. 5 is a view showing an example of a hardware configuration of the communication system 10.

FIG. 5 shows an example of a hardware configuration of the communication system 10. The communication system 10 of the embodiment is provided with a CPU peripheral unit having a CPU 1000, a RAM 1020 and a graphics controller 1075 which are interconnected by a host controller 1082, and a display 1800, an I/O unit having a communication interface 1030, a hard disk drive 1040 and a CD-ROM drive 1060 which are connected to the host controller 1082 by an I/O controller 1084, and a legacy I/O unit having a ROM 1010, a flexible disk drive 1050 and an I/O chip 1070 which are connected to the I/O controller 1084.

The host controller 1082 interconnects the RAM 1020, the CPU 1000 which accesses the RAM 1020 at a high transfer rate, and the graphics controller 1075. The CPU 1000 is operated by programs stored in the ROM 1010 and the RAM 1020 to control each unit. The graphics controller 1075 obtains image data generated on a frame buffer installed in the RAM 1020 by the CPU 1000 or the like to display it on the display 1080. Instead, the graphics controller 1075 may include a frame buffer for storing image data generated by the CPU 1000 or the like.

The I/O controller 1084 connects the communication interface 1030 which is a relatively high-speed I/O device, the hard disk drive 1040, and the CD-ROM drive 1060 to the host controller 1082. The communication interface 1030 communicates with other devices through a network. The hard disk drive 1040 stores programs and data used by the communication system 10. The CD-ROM drive 1060 reads a program or data from a CD-ROM 1095 to supply the program or data through the RAM 1020 to an I/O chip 1070.

The ROM 1010, and a relatively low-speed I/O device such as the flexible disk drive 1050 or the I/O chip 1070 are connected to the I/O controller 1084. The ROM 1010 stores boot programs executed by the CPU 1000 at the time of starting the communication system 10, a program dependent on hardware of the communication system 10, and the like. The flexible disk drive 1050 reads a program or data from a flexible disk 1090 to supply the program or data through the RAM 1020 to the I/O chip 1070. The I/O chip 1070 connects various I/O devices through the flexible disk 1090, and for example, a parallel port, a serial port, a keyboard port, a mouse port and the like. The I/O chip 1070 receives data corresponding to user's entry from the input device, and supplies the data to a program executed by the communication system 10.

The program supplied to the communication system 10 is stored in the flexible disk 1090, the CD-ROM 1095, or a recording medium such as an IC card, and supplied by a user. The program is read from the recording medium, and installed in the communication system 10 to be executed. The communication system 10 may record the encoded data sequence generated by the encoding device 100 in the recording medium and may supply the encoded data sequence to the user.

The program for realizing the communication system 10 is provided with first and second code encoding modules, a transceiver module, a receiver module, a storage module, first and second error correction modules, a below bounded distance decoding module, and a bounded distance decoding module. These modules are programs for causing the communication system 10 to function as the first and second code encoding units 110 and 120, the transceiver unit 150, the receiver unit 180, the storage unit 210, the first and second error correction units 220 and 230, the below bounded distance decoding control unit 240, and the bounded distance decoding control unit 250.

The above-described programs or modules may be stored in an outer storage medium. As a storage medium, other than the flexible disk 1090 and the CD-ROM 1095, an optical recording medium such as a DVD or a PD, a magneto-optical recording medium such as an MD, a tape medium, a semiconductor memory such as an IC card, or the like can be used. A storage device such as a hard disk or a RAM installed in a server system connected to a dedicated communication network or Internet may be used as a recording medium to supply the programs through the network to the communication system 10. The programs or modules may be mounted on an integrated circuit such as an ASIC, or as firmware.

As apparent from the foregoing description, the communication system 10 adds the concatenated codes, in which the outer and inner codes have complementary characteristics, to the input data sequence. Thus, the communication system 10 can obtain a large coding benefit from a relatively small parity overhead to execute effective error correction. Moreover, since the effects of erroneous correction caused by burst errors can be suppressed, and errors can be corrected by iterating minimum distance decoding based on the hard decision method, the communication system 10 can be operated by a simple circuit at a high speed. Further, since concatenated codes having high affinity with existing devices or standards using Reed-Solomon codes are used, the communication system 10 can be realized by an easily designed and manufactured circuit.

The preferred embodiment of the present invention has been described. However, it should be understood that a technical scope of the present invention is not limited to the embodiment, and various modifications and improvements can be made to the embodiment. As apparent from the appended claims, such modifications and improvements are within the technical scope of the present invention.

The invention claimed is:

1. An encoding device for adding an error correction code parity to an input data sequence, comprising:
    a first code encoding unit for adding a binary error correction code parity to each of a plurality of first data blocks into which the input data sequence is divided; and
    a second code encoding unit for adding a symbol error correction code for correcting an error by a symbol unit of a predetermined length to each of a plurality of second data blocks into which the input data sequence is divided in a form different from that of the plurality of first data blocks,
    wherein the number of bit errors to be corrected per total number of bits of the first data block to which the binary error correction code parity is added is larger than the number of bit errors to be corrected per total number of bits of the second data block to which the symbol error correction code parity is added;
    wherein when a total number of bits of the first data block to which the binary error correction code parity is added is set to n, a minimum distance between codes of the first data block is set to d, a length of the second data block to which the symbol error correction code is added is set to N symbol, a minimum distance between codes of the second data block is D, and a total number of bits of the symbol is m, the first code encoding unit and the second code encoding unit respectively add the binary error correction code parity and the symbol error correction code parity to each of the plurality of first data block and second block to satisfy the following inequality:

$$\frac{d-1}{2n} > \frac{D-1}{2mN}.$$

2. An encoding device according to claim 1, wherein the second code encoding unit selects partial data from each of the plurality of first data blocks to divide the input data sequence into the plurality of second data blocks.

3. An encoding device according to claim 1, wherein when the total number of bits of the first data block is n, and the total number of bits of the symbol is m, the first code encoding unit and the second code encoding unit respectively add the binary error correction code and the symbol error correction code to each of the plurality of first data block and second block where n is an integer multiple of m.

4. An encoding device according to claim 1, wherein the first code encoding unit adds, as the binary error correction code parity, a code having an error detection function for a larger number of bit errors than the number of bit errors to be corrected by the binary error correction code parity.

5. An encoding device according to claim 1, wherein concatenated codes are added in which each of the plurality of first data blocks becomes a connected part of the input data sequence, the first code encoding unit adds, as an inner code of the concatenated codes, the binary error correction code parity to the first data block, and the second code encoding unit adds, as an outer code of the concatenated codes, the symbol error correction code parity to the second data block.

6. An encoding device according to claim 1, wherein the second code encoding unit adds, as the symbol error correction code parity, a Reed-Solomon code parity to the second data block.

7. An encoding device according to claim 1, wherein the first code encoding unit adds, as the binary error code parity, a code having a burst error detection function to the first data block.

8. An encoding device according to claim 7, wherein the binary error correction code parity is capable of double-bit error correction.

9. A decoding device for correcting errors of an encoded data sequence to which an error correction code parity is added, comprising:

a storage unit for storing the encoded data sequence;

a first error correction unit for correcting an error of each of a plurality of first data blocks, into which the encoded data sequence is divided, by minimum distance decoding of a binary error correction code; and a second error correction unit for correcting an error of each of a plurality of second data blocks, into which the encoded data sequence is divided in a form different from that of the plurality of first data blocks, by minimum distance decoding of a symbol error correction code for error correction by a symbol unit of a predetermined length, wherein the number of bit errors to be corrected by the binary error correction code per total number of bits of the first data block is larger than the number of bit errors to be corrected by the symbol error correction code per total number of bits of the second data block;

wherein when a total number of bits of the first data block is set to n, a minimum distance between codes of the first data block is set to d, a length of the second data block is set to N symbol, a minimum distance between codes of the second data block is D, and a total number of bits of the symbol is m, the first error correction unit and the second error correction unit execute error correction by the binary error correction code and the symbol error correction code respectively to satisfy the following inequality:

$$\frac{d-1}{2n} > \frac{D-1}{2mN}.$$

10. A decoding device for correcting errors of an encoded data sequence to which an error correction code is added, comprising:

a storage unit for storing the encoded data sequence;

a first error correction unit for correcting an error of each of a plurality of first data blocks, into which the encoded data sequence is divided, by minimum distance decoding of a binary error correction code;

a second error correction unit for correcting an error of each of a plurality of second data blocks, into which the encoded data sequence is divided in a form different from that of the plurality of first data blocks, by minimum distance decoding of a symbol error correction code for error correction by a symbol unit of a predetermined length;

a below bounded distance decoding control unit for causing the first error correction unit and the second error correction unit to respectively correct errors having smaller distance than limit error correction capabilities of the binary error correction code and the symbol error correction code; and a bounded distance decoding control unit for causing, if determination is made that the errors are not corrected by the below bounded distance decoding control unit, each of the first error correction unit and the second error correction unit to correct errors by using the limit error correction capability of each of the binary error correction code and the symbol error correction code.

11. A decoding device according to claim 10, wherein the binary error correction code has a burst error detection function and a burst error correction function, the below bounded distance decoding control unit further causes the first error correction unit to detect burst errors, and the bounded distance decoding control unit further causes the first error correction unit to correct the burst errors.

12. A decoding device according to claim 10, wherein the below bounded distance decoding control unit causes each of the first error correction unit and the second error correction unit to correct the errors of a distance smaller than the limit error correction capability by a predetermined number of times, and the bounded distance decoding control unit causes, if determination is made that the errors of the distance smaller than the limit error correction capability by the predetermined number of times are not corrected, each of the first error correction unit and the second error correction unit to correct the errors by using the limit error correction capability.

13. An encoding method for adding an error correction code parity to an input data sequence, comprising:
- a first code encoding step for adding a binary error correction code parity to each of a plurality of first data blocks into which the input data sequence is divided; and
- a second code encoding step for adding a symbol error correction code for correcting an error by a symbol unit of a predetermined length to each of a plurality of second data blocks into which the input data sequence is divided in a form different from that of the plurality of first data blocks,
- wherein the number of bit errors to be corrected per total number of bits of the first data block to which the binary error correction code parity is added is larger than the number of bit errors to be corrected per total number of bits of the second data block to which the symbol error correction code parity is added.

14. An encoding method according to claim 13, wherein when a total number of bits of the first data block is set to n, a minimum distance between codes of the first data block is set to d, a length of the second data block is set to N symbol, a minimum distance between codes of the second data block is D, and a total number of bits of the symbol is m, the first error correction unit and the second error correction unit execute error correction by the binary error correction code and the symbol error correction code respectively to satisfy the following inequality:

$$\frac{d-1}{2n} > \frac{D-1}{2mN}.$$

15. A decoding method for correcting errors of an encoded data sequence to which an error correction code parity is added, comprising:
- a storage step for storing the encoded data sequence;
- a first error correction step for correcting an error of each of a plurality of first data blocks, into which the encoded data sequence is divided, by minimum distance decoding of a binary error correction code; and
- a second error correction step for correcting an error of each of a plurality of second data blocks, into which the encoded data sequence is divided in a form different from that of the plurality of first data blocks, by minimum distance decoding of a symbol error correction code for error correction by a symbol unit of a predetermined length,
- wherein the number of bit errors to be corrected by the binary error correction code per total number of bits of the first data block is larger than the number of bit errors to be corrected by the symbol error correction code per total number of bits of the second data block.

16. An decoding method according to claim 15, wherein when a total number of bits of the first data block is set to n, a minimum distance between codes of the first data block is set to d, a length of the second data block is set to N symbol, a minimum distance between codes of the second data block is D, and a total number of bits of the symbol is m, the first error correction unit and the second error correction unit execute error correction by the binary error correction code and the symbol error correction code respectively to satisfy the following inequality:

$$\frac{d-1}{2n} > \frac{D-1}{2mN}.$$

17. A decoding method for correcting errors of an encoded data sequence to which an error correction code is added, comprising:
- a storage step for storing the encoded data sequence;
- a first below bounded distance decoding step for executing error correction of minimum distance decoding by an under-limit error correction capability of a binary error correction code for each of a plurality of first data blocks into which the encoded data sequence is divided;
- a second below bounded distance decoding step for executing error correction of minimum distance decoding by an under-limit error correction capability of a symbol error correction code for error correction by a symbol unit of a predetermined length for each of a plurality of second data blocks into which the encoded data sequence is divided in a form different from that of the plurality of first data blocks;
- a determination step for determining whether the errors of the encoded data sequence are corrected or not in the first below bounded distance decoding step and the second below bounded distance decoding step; and
- a bounded distance decoding step for executing, if determination is made that the errors of the encoded data sequence are not corrected, error correction of minimum distance decoding by a limit error correction capability of each of the binary error correction code and the symbol error correction code.

18. A program embodied in computer memory for causing a computer to add an error correction code parity to an input data sequence, the program comprising:
- a first code encoding unit for adding a binary error correction code parity to each of a plurality of first data blocks into which the input data sequence is divided; and
- a second code encoding unit for adding a symbol error correction code for correcting an error by a symbol unit of a predetermined length to each of a plurality of second data blocks into which the input data sequence is divided in a form different from that of the plurality of first data blocks,
- wherein the number of bit errors to be corrected per total number of bits of the first data block to which the binary error correction code parity is added is larger than the number of bit errors to be corrected per total number of bits of the second data block to which the symbol error correction code parity is added.

19. A program embodied in computer memory for correcting errors of an encoded data sequence to which an error correction code is added by a computer, the program comprising:
- a storage unit for storing the encoded data sequence;
- a first error correction unit for correcting an error of each of a plurality of first data blocks, into which the encoded data sequence is divided, by minimum distance decoding of a binary error correction code; and
- a second error correction unit for correcting an error of each of a plurality of second data blocks, into which the encoded data sequence is divided in a form different from that of the plurality of first data blocks, by minimum distance decoding of a symbol error correction code for error correction by a symbol unit of a predetermined length, wherein the number of bit errors to be corrected by the binary error correction code per total number of bits of the first data block is larger than the number of bit errors to be corrected by the symbol error correction code per total number of bits of the second data block.

20. A program embodied in computer memory for correcting errors of an encoded data sequence to which an error correction code is added by a computer, the program comprising:

storage unit for storing the encoded data sequence;

a first error correction unit for correcting an error of each of a plurality of the first data blocks, into which the encoded data sequence is divided, by minimum distance decoding of a binary error correction code;

a second error correction unit for correcting an error of each of a plurality of second data blocks, into which the encoded data sequence is divided in a form different from that of the plurality of first data blocks, by minimum distance decoding of a symbol error correction code for error correction by a symbol unit of a predetermined length;

a below bounded distance decoding control unit for causing the first error correction unit and the second error correction unit to respectively correct errors having smaller distance than limit error correction capabilities of the binary error correction code and the symbol error correction code; and a bounded distance decoding control unit for causing, if determination is made that the errors are not corrected by the below bounded distance decoding control unit, each of the first error correction unit and the second error correction unit to correct errors by using the limit error correction capability of each of the binary error correction code and the symbol error correction code.

21. A data recording medium for recording an input data sequence and an error correction code added to the input data sequence, comprising:

a data sequence recording area for recording the input data sequence;

a first code recording area for recording a binary error code parity recorded corresponding to each of a plurality of first data blocks, into which the input data sequence is divided, and used for correcting an error of each of the plurality of first data blocks; and a second code recording area for recording a symbol error correction code parity recorded corresponding to each of a plurality of second data blocks, into which the input data sequence is divided in a form different from that of the plurality of first data blocks, and used for correcting an error of each of the plurality of second data blocks by a symbol unit of a predetermined length, wherein the number of bit errors to be corrected per total number of bits of the first data block to which the binary error code parity is added is larger than the number of bit errors to be corrected per total number of bits of the second data block to which the symbol error correction code parity is added.

* * * * *